US 8,860,195 B2

(12) United States Patent
Lam

(10) Patent No.: US 8,860,195 B2
(45) Date of Patent: Oct. 14, 2014

(54) APPARATUS AND METHOD FOR INCREASING THE QUANTITY OF DISCRETE ELECTRONIC COMPONENTS IN AN INTEGRATED CIRCUIT PACKAGE

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 12/534,819

(22) Filed: Aug. 3, 2009

(65) Prior Publication Data

US 2009/0294957 A1    Dec. 3, 2009

Related U.S. Application Data

(62) Division of application No. 11/304,084, filed on Dec. 15, 2005, now abandoned.

(51) Int. Cl.
*H01L 23/02*    (2006.01)
(52) U.S. Cl.
USPC ............................ 257/678; 257/723; 257/724
(58) Field of Classification Search
USPC .......................................... 257/678, 723, 724
See application file for complete search history.

(56) References Cited

U.S. PATENT DOCUMENTS

| | | | |
|---|---|---|---|
| 5,478,773 A | 12/1995 | Dow et al. |
| 5,541,135 A | 7/1996 | Pfeifer et al. |
| 6,008,102 A | 12/1999 | Alford et al. |
| 6,075,712 A | 6/2000 | McMahon |
| 6,091,144 A | 7/2000 | Harada |
| 6,407,456 B1 | 6/2002 | Ball |
| 6,444,517 B1 | 9/2002 | Hsu et al. |
| 6,486,530 B1 | 11/2002 | Sasagawa et al. |
| 6,538,313 B1 | 3/2003 | Smith |
| 6,744,114 B2 | 6/2004 | Dentry et al. |
| 6,780,677 B2 | 8/2004 | Imasu et al. |
| 6,798,057 B2 | 9/2004 | Bolkin et al. |
| 6,884,658 B2 | 4/2005 | Akram |

(Continued)

FOREIGN PATENT DOCUMENTS

| | | |
|---|---|---|
| GB | 2288074 A | 10/1995 |
| WO | WO-00/54337 A1 | 9/2000 |

(Continued)

OTHER PUBLICATIONS

"U.S. Appl. no. 11/456,685 Final Office Action mailed Aug. 9, 2010", 15 pgs.

(Continued)

*Primary Examiner* — Jae Lee
(74) *Attorney, Agent, or Firm* — Fish & Richardson P.C.

(57) ABSTRACT

An apparatus and method for incorporating discrete passive components into an integrated circuit package. A first surface of a substrate is coated with a material to mechanically protect the first surface. A first metal layer and then an insulating layer are formed on a second surface of the substrate. Selected areas are removed from the insulating and a second metal layer is formed over the insulating layer and the exposed metal layer. Selected areas of the second metal layer are removed to form a plurality of structures, including at least one of a wirebonding pad, a solder-bonding pad, a device interconnect circuit, or an attach pad to which an electronic component may be attached. An electronic component may be attached to at least one of the structures. The resulting integrated circuit die may be incorporated into an electronic package.

13 Claims, 6 Drawing Sheets

(56) References Cited

U.S. PATENT DOCUMENTS

| | | | |
|---|---|---|---|
| 6,890,829 B2 | 5/2005 | Cheng et al. | |
| 7,142,000 B2 * | 11/2006 | Eldridge et al. | 324/750.05 |
| 7,239,025 B2 | 7/2007 | Farrar | |
| 7,335,994 B2 | 2/2008 | Klein et al. | |
| 7,497,005 B2 | 3/2009 | Forbes et al. | |
| 7,932,590 B2 | 4/2011 | Lam | |
| 2002/0086533 A1 | 7/2002 | Jang et al. | |
| 2003/0020171 A1 | 1/2003 | Dutta et al. | |
| 2003/0045044 A1 | 3/2003 | Dentry et al. | |
| 2003/0077871 A1 | 4/2003 | Cheng et al. | |
| 2004/0036569 A1 | 2/2004 | Tsai et al. | |
| 2004/0041270 A1 | 3/2004 | Shimizu et al. | |
| 2004/0178473 A1 | 9/2004 | Dentry et al. | |
| 2005/0002167 A1 | 1/2005 | Hsuan et al. | |
| 2005/0046041 A1 | 3/2005 | Tsai | |
| 2005/0127397 A1 | 6/2005 | Borges et al. | |
| 2005/0133916 A1 | 6/2005 | Karnezos | |
| 2005/0253257 A1 | 11/2005 | Chiu et al. | |
| 2006/0011702 A1 | 1/2006 | Funaya et al. | |
| 2006/0027841 A1 * | 2/2006 | Tamaki | 257/286 |
| 2006/0030150 A1 * | 2/2006 | Jiang et al. | 438/673 |
| 2006/0245308 A1 | 11/2006 | Macropoulos et al. | |
| 2006/0286716 A1 | 12/2006 | Takayama | |
| 2007/0090495 A1 * | 4/2007 | Kim et al. | 257/666 |
| 2007/0138572 A1 | 6/2007 | Lam | |
| 2007/0138628 A1 | 6/2007 | Lam | |
| 2008/0054428 A1 | 3/2008 | Lam | |

FOREIGN PATENT DOCUMENTS

| | | | |
|---|---|---|---|
| WO | WO-2008/008581 | A2 | 1/2008 |
| WO | WO 2008/008581 | A3 | 1/2008 |
| WO | WO-2008/008587 | A2 | 1/2008 |
| WO | WO 2008/008587 | A3 | 1/2008 |

OTHER PUBLICATIONS

"U.S. Appl. No. 11/456,685, Notice of Non-Compliant Amendment mailed Dec. 30, 2008", 3 pgs.

"U.S. Appl. No. 11/456,685, Response filed Jan. 30, 2009 to Notice of Non-Compliant Amendment mailed Dec. 30, 2009", 1 pg.

"U.S. Appl. No. 11/456,685, Response filed Oct. 12, 2010 to Final Office Action mailed Aug. 9, 2010", 5 pgs.

"U.S. Appl. No. 11/304,084, Amendment and Response filed Jan. 5, 2009 to Non-Final Office Action mailed Aug. 5, 2008", 13 pgs.

"U.S. Appl. No. 11/304,084, Final Office Action mailed Feb. 21, 2008", 11 pgs.

"U.S. Appl. No. 11/304,084, Final Office Action mailed Apr. 2, 2009", 10 pgs.

"U.S. Appl. No. 11/304,084, Non-Final Office Action mailed May 11, 2007", 12 pgs.

"U.S. Appl. No. 11/304,084, Non-Final Office Action mailed Aug. 5, 2008", 11 pgs.

"U.S. Appl. No. 11/304,084, Response filed Apr. 17, 2007 to Restriction Requirement mailed Aug. 5, 2007", 1 pg.

"U.S. Appl. No. 11/304,084, Response filed May 21, 2008 to Final Office Action mailed Feb. 21, 2008", 12 pgs.

"U.S. Appl. No. 11/304,084, Response filed Nov. 9, 2007 to Non-Final Office Action mailed May 11, 2007", 15 pgs.

"U.S. Appl. No. 11/304,084, Restriction Requirement mailed Apr. 5, 2007", 4 pgs.

"U.S. Appl. No. 11/456,685, Amendment and Response filed Sep. 15, 2008 to Non-Final Office Action mailed May 14, 2008", 17 pgs.

"U.S. Appl. No. 11/456,685, Non-Final Office Action mailed May 14, 2008", 13 pgs.

"U.S. Appl. No. 11/456,685, Notice of Non-Compliant Amendment mailed Nov. 17, 2009", 2 pgs.

"U.S. Appl. No. 11/456,685, Response filed Jan. 19, 2010 to Notice of Non-Compliant Amendment mailed Nov. 17, 2009", 8 pgs.

"U.S. Appl. No. 11/456,685, Response filed Apr. 28, 2008 to Restriction Requirement mailed Mar. 28, 2008", 5 pgs.

"U.S. Appl. No. 11/456,685, Response filed Aug. 25, 2009 to Election Requirement mailed Jun. 25, 2009", 8 pgs.

"U.S. Appl. No. 11/456,685, Restriction Requirement mailed Mar. 28, 2008", 6 pgs.

"U.S. Appl. No. 11/456,685, Restriction Requirement mailed Jun. 25, 2009", 5 pgs.

"U.S. Appl. No. 11/457,409, Final Office Action mailed Feb. 24, 2009", 14 pgs.

"U.S. Appl. No. 11/457,409, Non-Final Office Action mailed Mar. 31, 2008", 12 pgs.

"U.S. Appl. No. 11/457,409, Non-Final Office Action mailed Apr. 19, 2010", 5 pgs.

"U.S. Appl. No. 11/457,409, Non-Final Office Action mailed Jul. 23, 2009", 12 pgs.

"U.S. Appl. No. 11/457,409, Notice of Allowance mailed Dec. 30, 2009", 7 pgs.

"U.S. Appl. No. 11/457,409, Preliminary Amendment filed Oct. 13, 2006", 3 pgs.

"U.S. Appl. No. 11/457,409, Response filed Feb. 25, 2008 to Restriction Requirement mailed Jan. 25, 2008", 7 pgs.

"U.S. Appl. No. 11/457,409, Response filed Jun. 24, 2009 to Final Office Action mailed Feb. 24, 2009", 13 pgs.

"U.S. Appl. No. 11/457,409, Response filed Jun. 27, 2008 mailed Mar. 31, 2008", 15 pgs.

"U.S. Appl. No. 11/457,409, Response filed Oct. 23, 2009 to Non Final Office Action mailed Jul. 23, 2009", 10 pgs.

"U.S. Appl. No. 11/457,409, Response filed Dec. 1, 2008 to Restriction Requirement mailed Sep. 30, 2008", 8 pgs.

"U.S. Appl. No. 11/457,409, Restriction Requirement mailed Jan. 25, 2008", 6 pgs.

"U.S. Appl. No. 11/457,409, Restriction Requirement mailed Sep. 30, 2008", 6 pgs.

"International Application Serial No. PCT/US07/70612, International Search Report mailed Apr. 21, 2008", 2 pgs.

"International Application Serial No. PCT/US07/70612, Written Opinion Apr. 21, 2008", 10 pgs.

"International Application Serial No. PCT/US2007/071079, International Search Report mailed May 16, 2008", 4 pgs.

"International Application Serial No. PCT/US2007/071079, Written Opinion mailed May 16, 2008", 5 pgs.

* cited by examiner

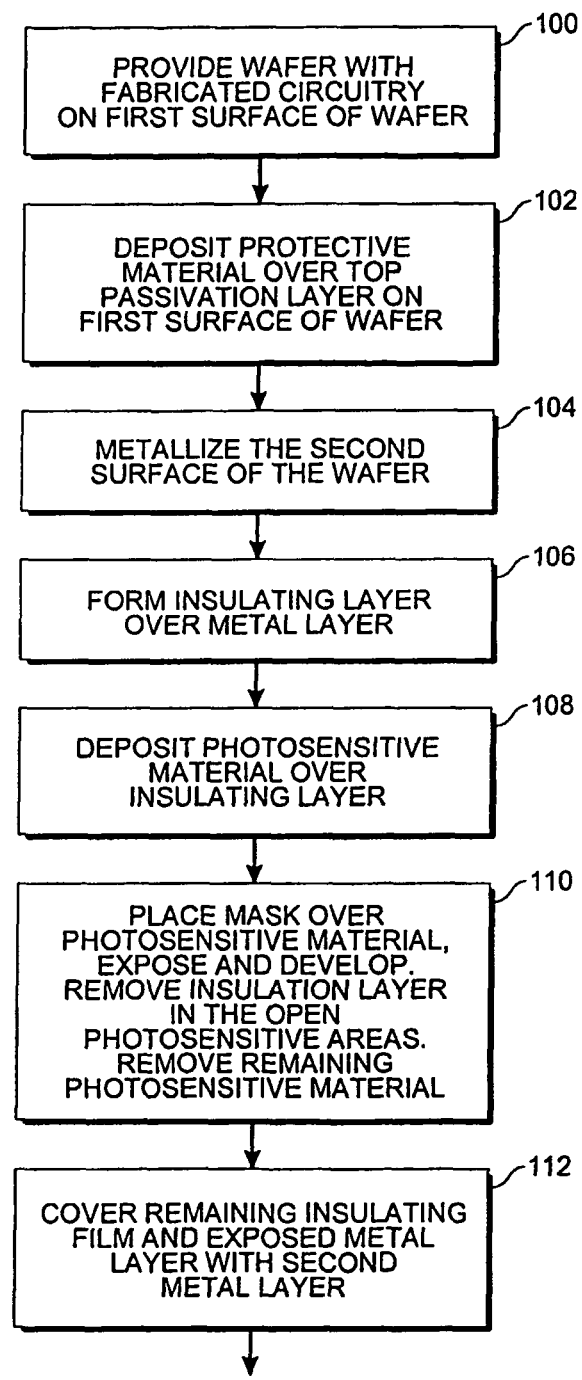
Fig._1a

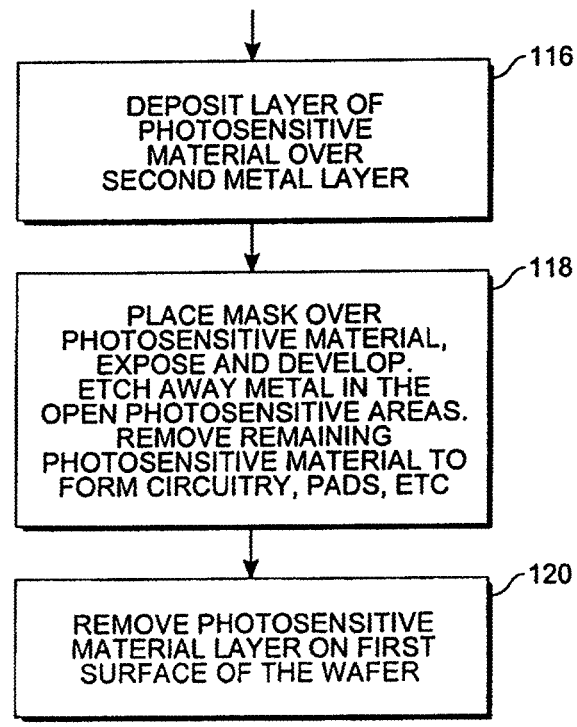
Fig._1b

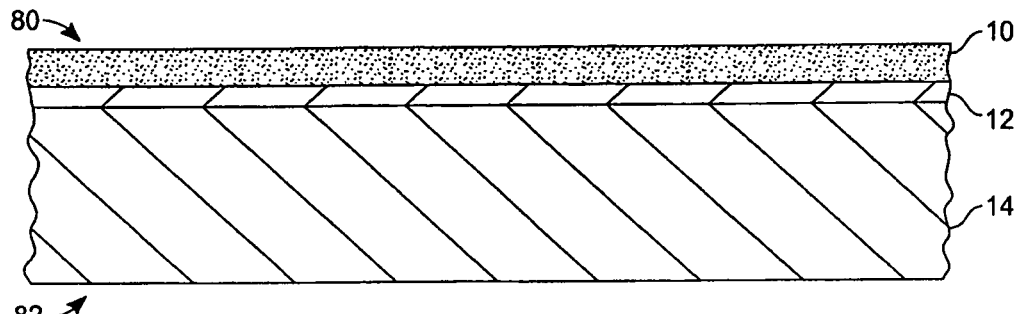
Fig. _2a
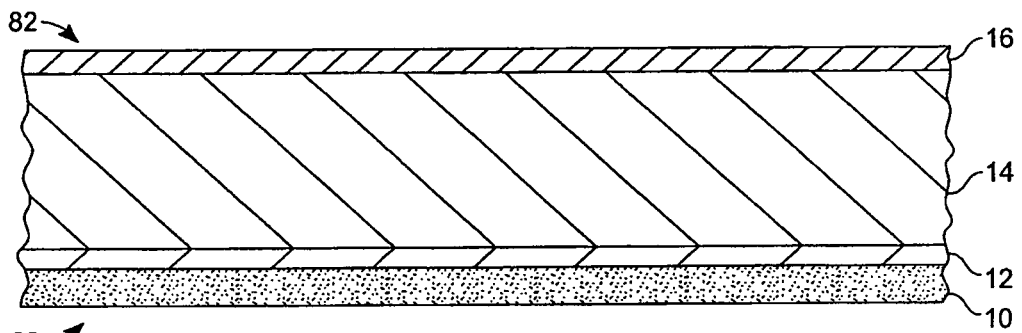
Fig. _2b
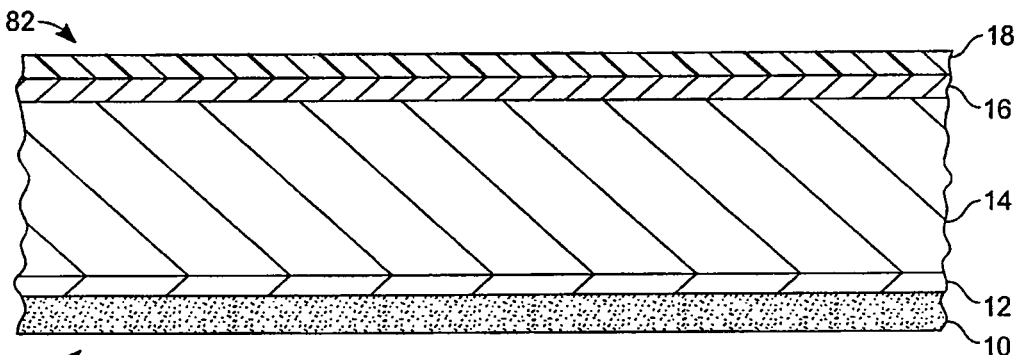
Fig. _2c
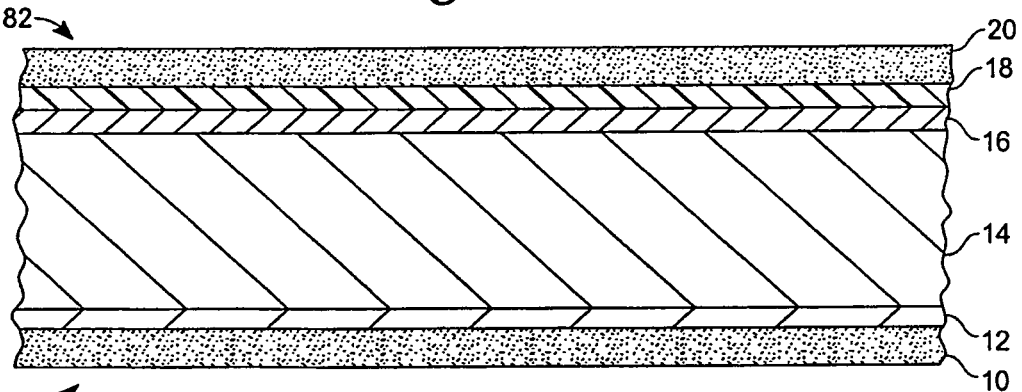
Fig. _2d

APPARATUS AND METHOD FOR INCREASING THE QUANTITY OF DISCRETE ELECTRONIC COMPONENTS IN AN INTEGRATED CIRCUIT PACKAGE

RELATED APPLICATIONS

This application is a divisional of U.S. patent application Ser. No. 11/304,084, filed on Dec. 15, 2005 now abandoned, which is hereby incorporated by reference in its entirety.

TECHNICAL FIELD

The present invention generally concerns fabrication of semiconductor devices, particularly semiconductor devices incorporated in integrated circuit packages.

BACKGROUND

Miniaturization of integrated circuit (IC) packages which may be incorporated in portable consumer products such as cellular phones, and mobile or laptop computers, has become increasingly important. One approach to miniaturization is the use of multi-chip modules where multiple chips having related functions are incorporated in a single package.

Single packages may also include stacked chips, in which chips are vertically stacked on top of each other. A potential drawback to using stacked die techniques is that no interconnection exists on the surfaces of the stacked die; the die interconnect is limited to die-to-die and die-to-substrate interconnections. Therefore, the IC die count is typically limited to one die per attach surface. It is not feasible to attach discrete electronic components to these surfaces since they typically require solderable attachment lands and interconnect circuitry or a noble metal surface for low contact resistance connections.

As such, it would be desirable to improve the manner in which discrete electronic components are incorporated in IC packages, such as utilizing die surfaces not conventionally used for die interconnections.

SUMMARY

In one embodiment, a method of fabrication comprises providing a substrate with a first surface having a passivation layer. At least one structure is built on a second surface of the substrate; an electronic component is to be attached to at least one structure. The structures that may be built include a wirebonding pad, a solder-bonding pad, a device interconnect circuit, or an attach pad to which an electronic component may be attached.

Another embodiment is an electronic package. The electronic package comprises a substrate which is coupled to a first surface of an integrated circuit die. The first surface of the integrated circuit die has means for coupling to the first surface of the substrate and has at least one first electronic component attached to the first surface of the integrated circuit die. At least one structure is attached to a second surface of the integrated circuit die.

Yet another embodiment is an electronic package comprising a substrate which is coupled to a flip chip. At least one first electronic component and means for coupling the flip chip to the substrate is attached to a first surface of the flip chip. At least one structure is attached to a second surface of the flip chip.

In another embodiment, a semiconductor device comprises a substrate having a first surface and a second surface, a passivation layer on the first surface of the substrate, and at least one structure attached to the second surface of the substrate. The structure is configured to be coupled to an electronic component.

In yet another embodiment, a method of integrated circuit device packaging comprises providing a substrate, coupling a first surface of an integrated circuit die to the substrate, and attaching at least one electronic component to at least one structure on a second surface of the integrated circuit die. The first surface of the integrated circuit die is coupled to at least one electronic component.

BRIEF DESCRIPTION OF THE DRAWINGS

FIGS. 1a-1b are flowcharts of a fabrication process in an exemplary embodiment of the invention.

FIGS. 2a-2j are diagrams showing stages of fabrication in an exemplary embodiment of the invention.

DETAILED DESCRIPTION

Figure 2E:
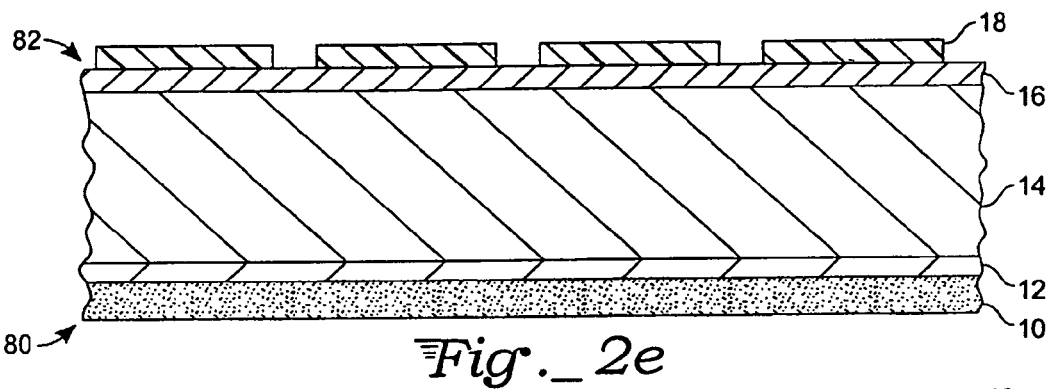

In FIG. 1a, an exemplary process for fabricating a semiconductor device with circuitry on both surfaces of the device (such that one surface connects the device to an electronic package's substrate (such as a printed circuit board ("PCB")) and another surface may be used to attach discrete electronic components) is shown. A wafer is provided with fabricated circuitry on a first surface of the wafer (block 100). The wafer may be made of any suitable semiconductor material, such as silicon or gallium arsenide, used in the art. It should also be appreciated that any substrate (such as silicon on an insulator), or semiconductor substrate, including the wafer, may be used in various embodiments. The device substrate should not be confused with the same substrate often used to generally label PCBs. The fabricated devices on the first surface are produced through conventional semiconductor manufacturing methods.

A removable layer, for mechanical protection for the first surface of the semiconductor substrate, such as photoresist or dry film, is deposited over a top passivation layer on the first surface of the wafer (block 102), where the fabricated circuitry is located. In FIG. 2a, the wafer 14 has a first surface 80 and a second surface 82, with a passivation layer 12 and a layer of protective material 10 on a first surface 80 of the wafer 14, which also contains the fabricated devices (not shown here). The layer of protective material 10 is typically 1 to 10 microns thick and provides mechanical protection to the passivation layer 12, which in turn protects the active device circuitry. The layer of protective material is formed using methods well-known to those of skill in the art.

The second surface of the wafer is then metallized (FIG. 1a, block 104). In FIG. 2b, the wafer 14 is turned "upside down" and a metal layer 16 is formed over the second surface 82 of the wafer 14. In one embodiment, the second surface 82 of the wafer 14 is blanket metallized by standard metal deposition processes, such as evaporation or chemical vapor deposition ("CVD"), sputtering, and plating. The resulting metal layer 16 is typically about 0.1 micron to 10 microns thick. The metal layer 16 provides RF shielding and wirebonding functions. The metal layer 16 may be a single layer, for example, aluminum (Al), or may be formed of multiple layers, using metals such as titanium tungsten-gold (TiW—Au), titanium-gold (Ti—Au), chromium-gold (Cr—Au), titanium tungsten-nickel-gold (TiW—Ni—Au), titanium-nickel-gold (Ti—Ni—Au), titanium-copper-nickel-gold (Ti—Cu—Ni—Au), titanium-tungsten-copper-nickel-silver (TiW—Cu—Ni—Ag), etc. Metal layer 16 choices may be selected based on the mechanism used to attach components to the semiconductor device fabricated on the wafer. For example, the use of gold, silver, and/or palladium is suitable for wire-bonding and the use of nickel and copper is suitable for soldering. Nickel is a good diffusion barrier. Titanium, titanium tungsten, and chromium provide adhesion of the metal film stack to the wafer.

An insulating layer is formed over the metal layer (FIG. 1a, block 106). In FIG. 2c, an insulating film 18, such as polyimide, benzocyclobutene (BCB), etc., is formed over the metal layer 16. The insulating film 18 is typically about 2 to 15 microns thick. The insulating film 18 is formed using methods well-known to those of skill in the art. This insulating film 18 may be either photo-definable or standard non-photo-sensitive film.

In the case of using a non-photo-sensitive insulating film, a photosensitive material, such as photoresist, is deposited over the insulating film layer (FIG. 1a, block 108). In FIG. 2d, a layer of photosensitive film (typically 1 to 10 microns), such as photoresist 20, is deposited over the insulating film 18. This layer 20 of photoresist is patterned and developed using methods well-known to those of skill in the art.

A mask is placed over the photosensitive material, such as photoresist, and then exposed and etched away (FIG. 1a, block 110). The insulating film layer that is now exposed is removed using wet etch or dry etch techniques. The remaining photosensitive material is also removed using methods well-known to those of skill in the art (FIG. 1a, block 110). In FIG. 2e, the second surface 82 of the wafer 14 has a patterned insulating film layer 18 remaining on the metal layer 16 after the removal of the layer of photoresist. The method just described uses a negative acting photoresist. A positive acting photoresist can also be used to achieve the same goal.

Figure 2F:
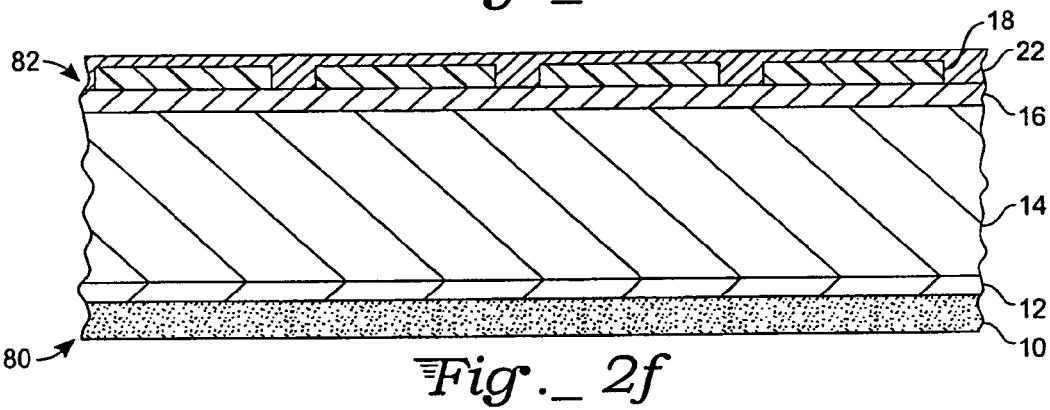

The remaining insulating film and exposed metal layer is covered with a second metal layer (FIG. 1a, block 112). In one embodiment, the surface is blanket metalized employing processes such as sputtering or plating. Other deposition processes known in the art may also be employed. In FIG. 2f, the second metal layer 22 covers the insulating film 18 and the exposed metal layer 16. The second metal layer is typically about 0.1 to 10 microns thick. The second metal layer 22 may be a single layer, for example, aluminum (Al), or may be formed of multiple layers, using metals such as titanium tungsten-gold (TiW—Au), titanium-gold (Ti—Au), chromium-gold (Cr—Au), titanium tungsten-nickel-gold (TiW—Ni—Au), titanium-nickel-gold (Ti—Ni—Au), titanium-copper-nickel-gold (Ti—Cu—Ni—Au), titanium-tungsten-copper-nickel-silver (TiW—Cu—Ni—Ag), etc. In other embodiments, the metal layer 22 may be formed of metal which are wirebondable or solderable (such as copper, silver, etc.) or serve as a diffusion barrier (e.g., nickel).

Figure 2G:
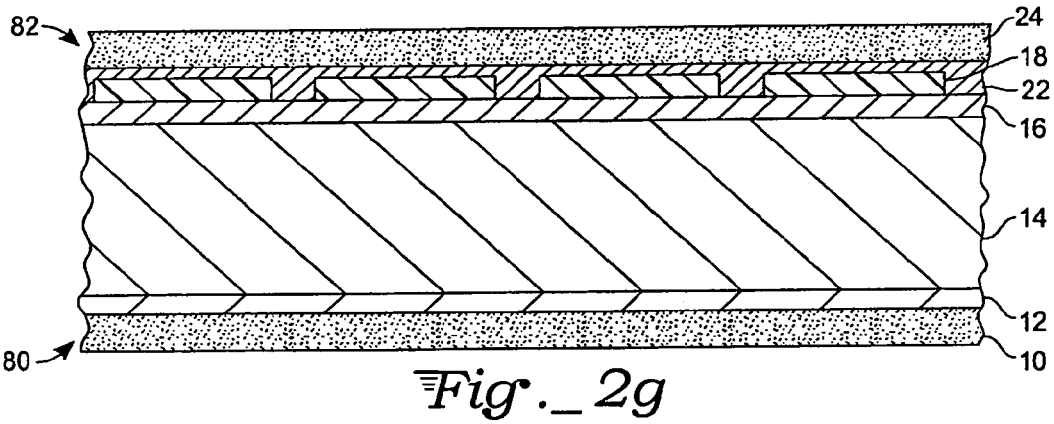

A layer of photosensitive material, such as photoresist, is deposited over the second metal layer (FIG. 1b, block 116). In FIG. 2g, a photosensitive film layer 24 has been deposited on the second metal layer 22. The photosensitive film layer 24 is typically about 1 to 10 microns thick. This layer 24 is patterned and developed using methods well-known to those of skill in the art.

Figure 2H:
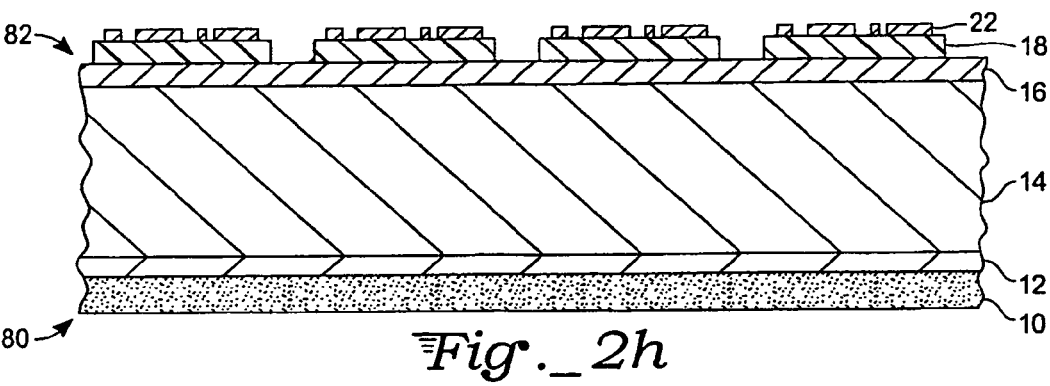

A mask is placed over the photosensitive material, such as photoresist, and then exposed and developed. The metal in the developed areas is then etched away (FIG. 1b, block 118). The remaining photosensitive material is also removed using methods well-known to those of skill in the art (FIG. 1, block 118). In FIG. 2h, the exposed areas of the second metal layer which were not protected by the mask are etched away, leaving only the patterned second metal layer. These remaining areas of the second metal layer 22 form interconnect circuitry, bond pads, discrete passive component attach pads, etc.

Figure 2I:
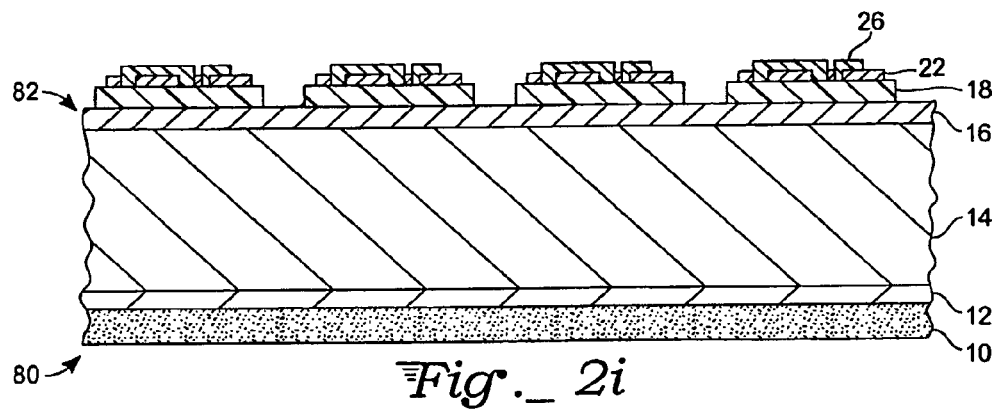

In one embodiment shown in FIG. 2i, the metal circuitry on the second surface 82 of the wafer 14 may be protected by an optional coating 26 of insulation, such as polyimide, BCB, etc. The coating 26 may be deposited and then patterned (for instance, by forming, patterning, developing, and etching photoresist in a manner known to those of skill in the art) to form the desired coating 26.

Figure 2J:
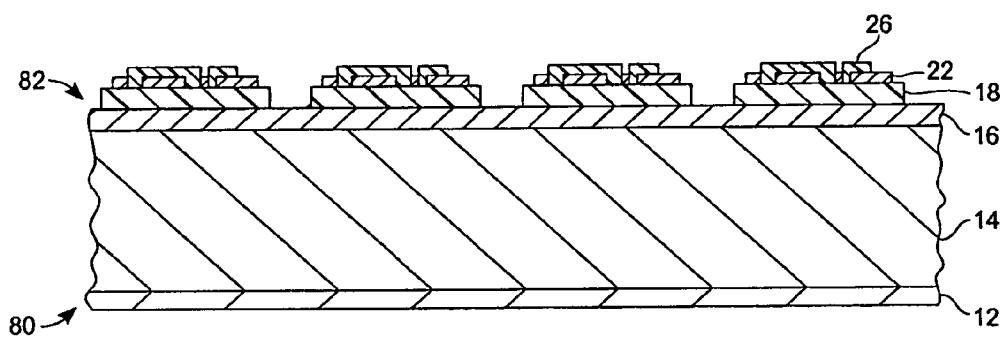

The layer of protective material 10 initially formed over the passivation layer 12 on the first surface 80 of the wafer 14 is removed using methods well-known to those of skill in the art. With reference to FIG. 2j, the passivation layer 12 is now the top-most layer on the first surface 80 of the wafer 14.

The "build-up" fabrication discussed above in FIGS. 1a-1b and 2a-2j may be carried out at a substrate level. Where the substrate is a wafer, the wafer may be subsequently singulated at package assembly, forming IC dies. The IC dies created from the fabrication process described in FIGS. 1a-1b and 2a-2j (including other embodiments where the substrate is not a wafer) serve as the semiconductor device that will be implemented in the IC device package. The IC dies are used to form flip chips or wafer level chip size packages (CSP), although other types of chips may be used.

Figure 3:
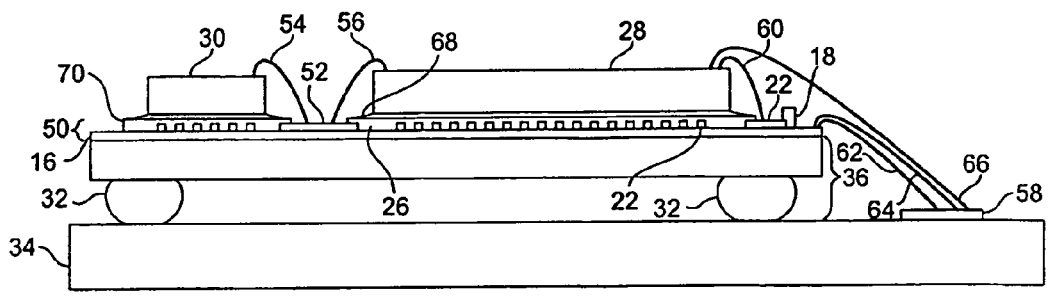
FIG. 3 is a view of a chip fabricated in accordance with steps shown in FIGS. 2a-2j attached to a substrate.

With reference to FIG. 3, an exemplary flip-chip 36 with fabricated structures on the bare silicon side of the chip 36 is shown attached to an electronic package's substrate, here a PCB, such as a package 4-layer laminate substrate 34. (The chip 36 may have components on the front, or passivation, side of the chip in other embodiments; however, these are not pictured in this embodiment.) The chip 36 is attached to the 4-layer laminate substrate 34 with solder balls 32. The area of fabrication 50 on the silicon side of the chip 36 includes a metal layer 16 which provides RF shielding and/or circuit grounding. Components 30, 28 may be mounted on attach pads 70, 68 formed over the metal layer 16. Component 30 is wirebonded 54 to metal bond pad 52 while component 28 is also wirebonded 56, 60 to metal bond pads 52, 22. Metal bond pad 52 also serves as an interconnect. Component 28 is also wirebonded 66 to a bond pad 58 on the package substrate 34. Leads 62, 64 connect the metal layer 16 to substrate connection pad 58, or ground, and thus provide ground-signal-ground shielding.

Various components can be attached to the attach pads. The active and passive components which may be attached include, but are not limited to, crystals, transceiver ICs, power management ICs, EEPROM ICs, switches, baluns, capacitors, etc. The components may be attached in a variety of ways, including soldering and attaching with a conductive epoxy. These components may be attached and interconnected at wafer level prior to wafer dicing, or attached after saw singulation, or may be attached and interconnected at package assembly, after the chip has been attached to the product substrate.

Figure 4:
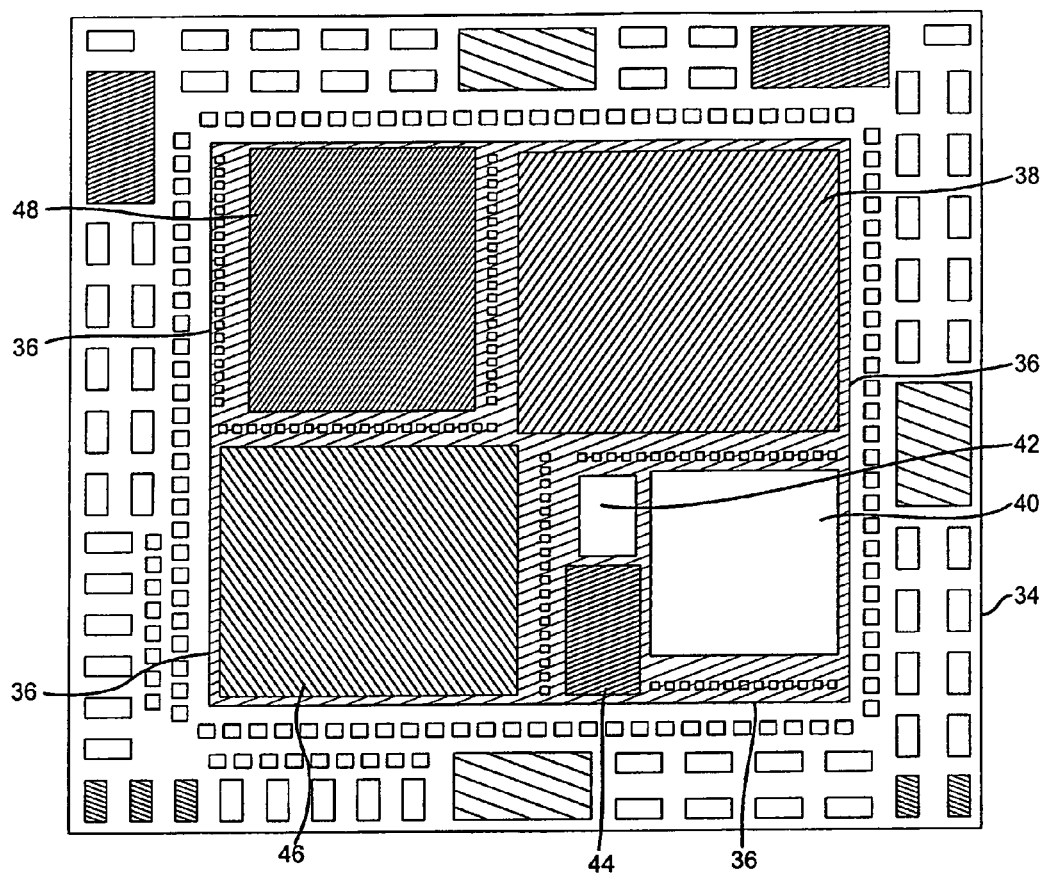
FIG. 4 is an overhead plan of a multi-chip module incorporating chips fabricated in accordance with steps shown in FIGS. 2a-2j.

FIG. 4 shows an exemplary plan view of a multi-chip module using IC chips 36, in this case, flip-chips, with fabricated structures on the bare silicon side of the chip. In this exemplary embodiment, a number of different components have been attached to the chips 36 mounted on the four-layer substrate 34. These components include a crystal 48, a power management IC 46, a balun 44, a switch 42, a transceiver IC

Figure 5:
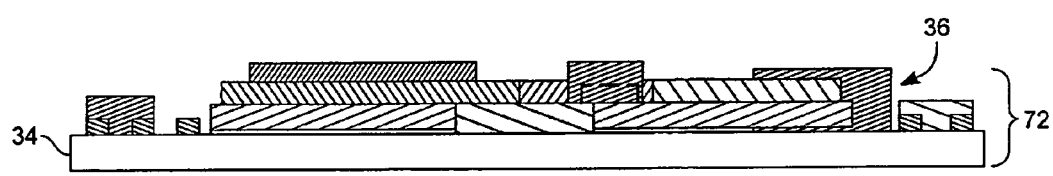
FIG. 5 is a side view of a multi-chip module incorporating chips fabricated in accordance with steps shown in FIGS. 2a-2j.

38, and an EEPROM IC 40. In other embodiments, any number of different components and arrangements may be employed and may be mounted on chips other than flip-chips; a wide range of package substrates, with different numbers of layers which may be made of various materials may also be employed. A side elevation of this package is shown in FIG. 5 (with some passives omitted for clarity). In this exemplary embodiment, the height of the package 72, including the substrate and the attached components does not exceed 1.5 mm.

Using the approaches described above, the size of electronic packages may be reduced. This is particularly important given the trend towards miniaturization, especially for portable products such as cellular phones.

While the preceding description has described specific embodiments, it will be evident to a skilled artisan that various changes and modifications can be made to these embodiments. For example, metal or conductive layers other than those described and shown may be used (e.g., platinum, tantalum, etc.). A skilled artisan will recognize that such conductive layers may be deposited or formed by methods and techniques other than those described herein (e.g., copper may be formed by a dual damascene technique known to those of skill in the art). The specification and drawings, therefore, are to be regarded in an illustrative rather than a restrictive sense.

What is claimed is:

1. An electronic package comprising:
   a package substrate including a top surface;
   an integrated circuit die attached to the top surface of the package substrate, the integrated circuit die including a device substrate having a first and second surface, the first surface facing the top surface of the package substrate and having a passivation layer formed thereon;
   a metal layer formed directly on the second surface of the device substrate;
   a first structure formed on the metal layer;
   a first electronic component attached to the first structure
   a second structure formed on the metal layer;
   a second electronic component attached to the second structure and coupled to the top surface of the package substrate by a wirebond; and
   a third structure formed on the metal layer, the third structure electrically coupled to at least one of the first and second electronic components.

2. The electronic package of claim 1 wherein the third structure comprises at least one of a wirebonding pad, a solder-bonding pad and a device interconnect circuit.

3. The electronic package of claim 1 wherein the second electronic component is one of an active component or a passive component.

4. The electronic package of claim 1 wherein the electronic package is a multichip module package.

5. The electronic package of claim 1 wherein the package substrate is a printed circuit board.

6. The electronic package of claim 1 wherein the integrated circuit die is a flip chip.

7. A method of integrated circuit device packaging comprising:
   fabricating an integrated circuit die from a device substrate having a first surface and a second surface, the fabricating comprising:
      forming a passivation layer on the first surface of the device substrate
      forming a metal layer directly on the second surface of the device substrate;
      forming at least one structure on the metal layer;
      attaching at least one second electronic component to the at least one structure formed on the metal layer; and
      singulating the device substrate so that the integrated circuit die includes the at least the one structure with the attached at least one second electronic component; and
   attaching the integrated circuit die to a package substrate by coupling the passivation layer of the integrated circuit die to the top surface of the package substrate, wherein the passivation layer of the integrated circuit die faces the top surface of the package substrate.

8. The method of claim 7 wherein the passivation layer of the integrated circuit die is coupled to the top surface of the package substrate by solder balls.

9. The method of claim 7 further comprising coupling the at least one second electronic component to the package substrate.

10. The method of claim 7 wherein the at least one second electronic component is coupled to the package substrate by a wirebond.

11. The method of claim 7 wherein the at least one second electronic component is one of an active or a passive component.

12. The method of claim 7 wherein the package substrate is a printed circuit board.

13. The method of claim 7 wherein the at least one structure formed on the metal layer comprises at least one of a wirebonding pad, a solder-bonding pad, a device interconnect circuit, or an attach pad to which the at least one second electronic component is attached.

* * * * *